United States Patent [19]

Serizawa et al.

[11] Patent Number: 5,542,176
[45] Date of Patent: Aug. 6, 1996

[54] RADIATION PLATE AND METHOD OF PRODUCING THE SAME

[75] Inventors: Hideaki Serizawa, 3-12, Ookubo 4-chome, Kisarazu-shi, Chiba-ken; Masayoshi Hayami, Tokyo; Kunimoto Yokozuka, Gunma-ken, all of Japan

[73] Assignee: Hideaki Serizawa, Chiba-Ken, Japan

[21] Appl. No.: 380,369

[22] Filed: Jan. 30, 1995

Related U.S. Application Data

[62] Division of Ser. No. 194,995, Feb. 14, 1994, abandoned.

[51] Int. Cl.$^6$ ............................... F28F 7/00; B23P 11/00
[52] U.S. Cl. .................... 29/890.03; 29/509; 165/185
[58] Field of Search ........................ 165/185, 76; 29/509, 29/890.03

[56] References Cited

U.S. PATENT DOCUMENTS 1,680,369  8/1928  Dugan ........................ 29/514
5,014,776  5/1991  Hess ........................ 29/890.03
5,038,858  8/1991  Jordan et al. ........................ 165/185

*Primary Examiner*—A. Michael Chambers
*Attorney, Agent, or Firm*—Elliot M. Olstein; Raymond J. Lillie

[57] ABSTRACT

This invention is to provide a radiation plate which prevents a generation of resonance phenomenon and being suitable for automation. A plurality of groove are formed in parallel in a base, and a part of a fin consisting of a material having relatively low hardness such as a pure aluminum formed with an engaging portion with concave or convex portion is fitted to each of the grooves. The pressure is applied in perpendicular direction to the vicinity of the grooves of the base to form a pressure deformed portion, and the part of the fin is fixed to the wall surface of the groove of the base by the bonding force of the pressure deformed portion against the fin. Otherwise the engaging portion of a fin formed as convex portion is fixed in the groove of the base by means of the pressure force.

1 Claim, 18 Drawing Sheets

5,542,176

RADIATION PLATE AND METHOD OF PRODUCING THE SAME

This application is a divisional application of Ser. No. 08/194,995, filed Feb. 14, 1994, now abandoned.

BACKGROUND OF THE INVENTION

FIELD OF THE INVENTION

This invention relates to radiation plates and a method of manufacturing the same which are used for radiation of heat against the rise of temperature of acoustic equipment, computers, semiconductor substrates and the like.

DESCRIPTION OF THE PRIOR ART

Radiation plates utilizing as fins members for radiation heat derived from acoustic equipment, computers, semiconductor substrates and the like have been heretofore in use. As these conventional radiation plates, there are available two types of fins such as extrusion fins 2 produced by an extruding process using a metal mold as shown in FIG. 23 and U-shaped boss caulked fins produced by bonding fins into U-shape and fixing the bent fins 4 to a base 6 by means of a boss caulking 8 as show in FIG. 24 through FIG. 26.

The extrusion fins 2 molded by extrusion molding are produced by flowing a melted material into a mold and extruding it. For this reason, the material used is required to have a certain hardness and normally, an alloy of hardness No. 37 is used.

When an alloy having low hardness for extrusion molding is used, the fin itself tends to be distorted, and as far as the extrusion molding is concerned, the hardness of the material has been a problem no one can avoid.

When the prior arts are reviewed, the mold used for the manufacturing the extrusion fins is expensive, and time and money are major factors as remolding and manufacturing of the mold are necessary whenever dimension change and configuration change occur.

Furthermore, the preparation of fabrication requires a lot of man-hour, and a production of small lot becomes a comparatively high in cost due to a generation of material loss even if the manufacturing is take place based on the preparation. In general, the extrusion process involves with making a product in a considerable quantity as one lot on the assumption, but once change of design, suspension of production and the like occur before the completion of the production, it becomes a great deal of loss.

Moreover, in the case of the extrusion fins, the material quality becomes generally an alloy for improvement of extrusion property which results in a high hardness, and once it is used for acoustic equipment and the like, in the first place, a resonance in high tone zone tends to occur, and in the second place, a radiation property as well as thermal conductivity is deteriorated when compared with pure aluminum which are some of the problems.

Also, it has been impossible to produce a fin with reduced thickness, a fin with increased height, or individual fin with unique change by the molding means, and from this point, a desire of an industry of the radiation plates, particularly, a desire of an acoustic equipment industry has not been met satisfactorily.

Next, in the case of fixing the fin with the boss caulking, the bending of the fins themselves is necessary, and the expense of the mold is required, and furthermore, a certain space is required for occupancy of the boss due to a disorder in an alignment of the fins after the U-shape bending, and the fins with small pitch is difficult to make, and for this reason, an inserting work of the boss into the hole of the fin is not easy, and an automation has been a complexity due to the foregoing points. And, in the couple by the boss caulking, forming a positive contact between the bottom surface of the fin and the base surface thereof is not easy, and a guarantee of the metal contact applies only to a small part of the periphery of the boss, and other portions tend to apart with a high probability, and a deterioration and insecurity of heat radiation characteristics are present and therefore, this system has big drawbacks.

SUMMARY OF THE INVENTION

In order to solve the foregoing problems this invention is characterized in that a base groove is provided on a radiation plate erected with a plurality of plate-like fins perpendicularly against the surface of the base, and the part of the fin is fixed into the groove, and a pressure deformed portion is provided in the vicinity of the groove on the base, and either the part of the fin is urged against the wall surface of the groove by the force of the pressure deformed portion or an end of the fin forms a convex portion and engages into the groove of the base by the force of the pressure.

By the foregoing arrangement, the pitch of the fins becomes small, and also, the fin made of pure aluminum having relatively low hardness may be positively coupled to the base.

DESCRIPTION OF THE PREFERRED EMBODIMENTS

Figure 1:
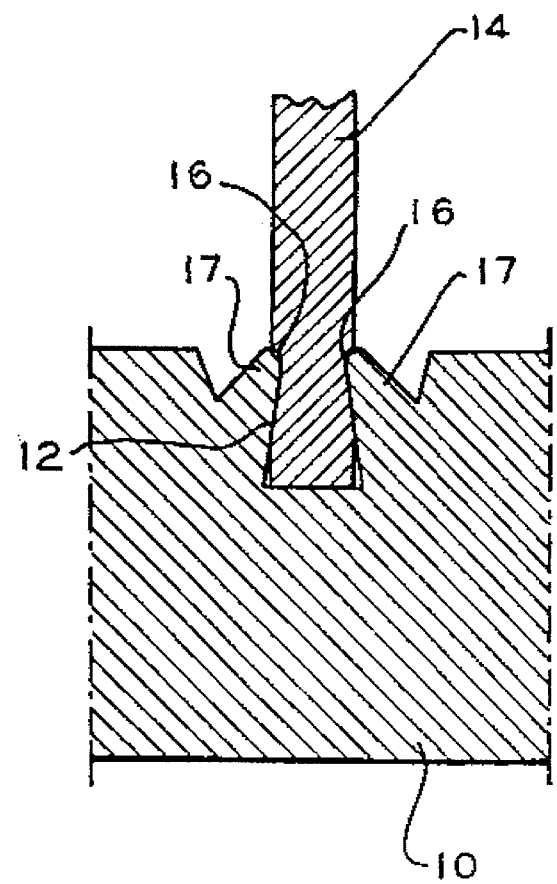
FIG. 1 is a cross section of an essential part of a radiation plate.
Figure 2:
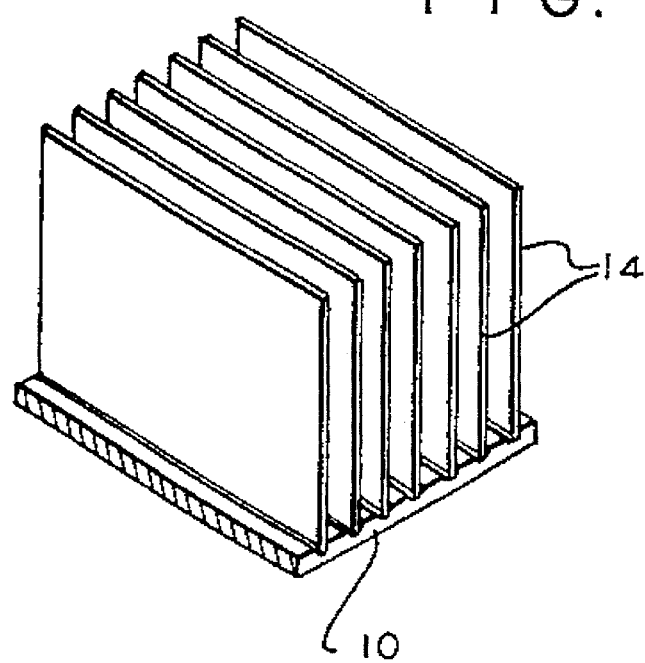
FIG. 2 is and external view of the radiation plate.
Figure 3:
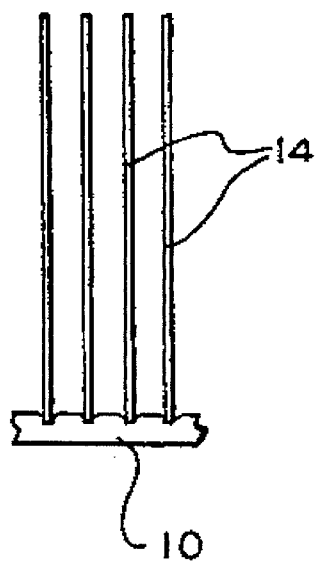
FIG. 3 is a side view of the radiation plate.
Figure 4:
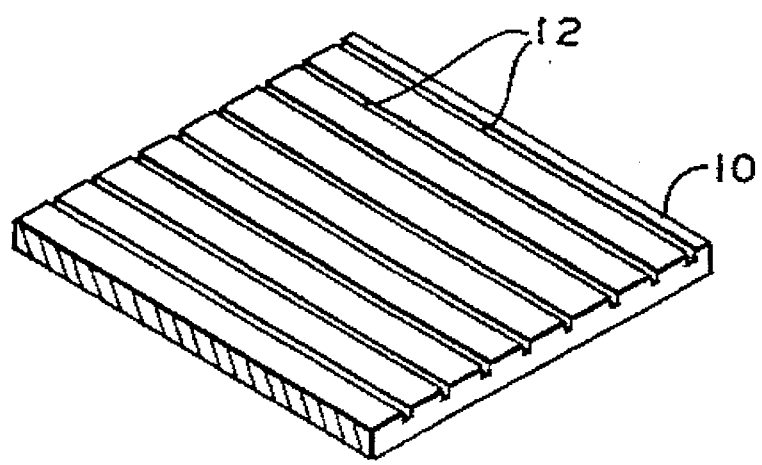
FIG. 4 is an external view of a base.
Figure 5:
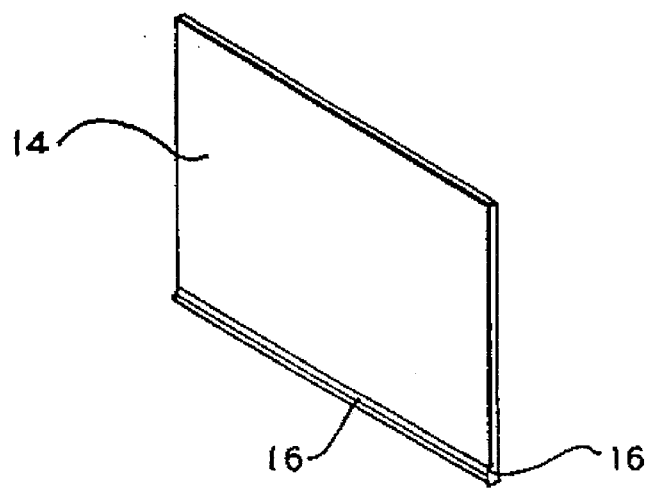
FIG. 5 is an external view of a fin.

A construction of this invention will be described in detail in the following by referring to embodiments shown on the attached drawings.

In FIG. 1 through FIG. 5, reference numeral 10 denotes a base of a radiation plate made of a material having a heat radiation effect such as pure aluminum, and being not capable of resonance, and grooves 12 are formed at a certain pitch on the base. Numeral 14 denotes a fin made of a material having a heat radiation effect such as a thin plate of pure aluminum and being not resonated, and an engaging portion 16 formed with a concave portion for preventing coma-out from the groove 12 is provided on both sides of the lower portion of the fin.

Figure 6:
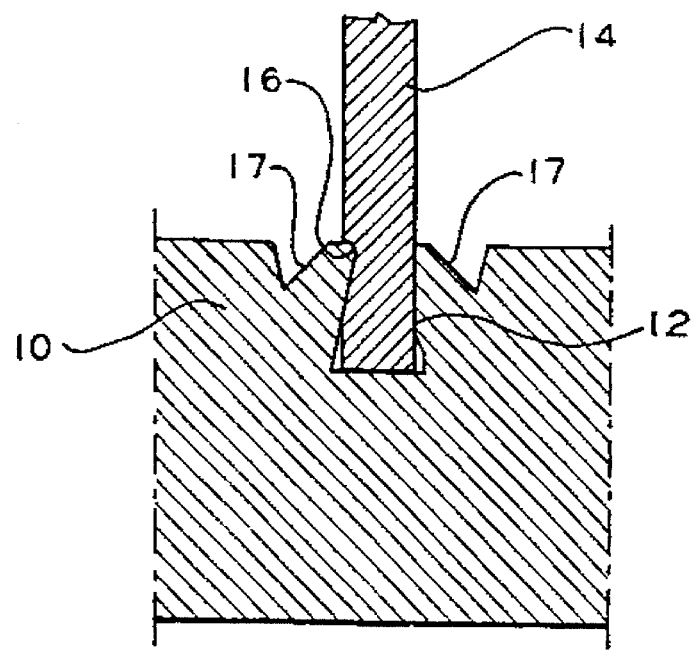
FIG. 6 is a cross section of an essential part showing another embodiment of the radiation plate.
Figure 7:
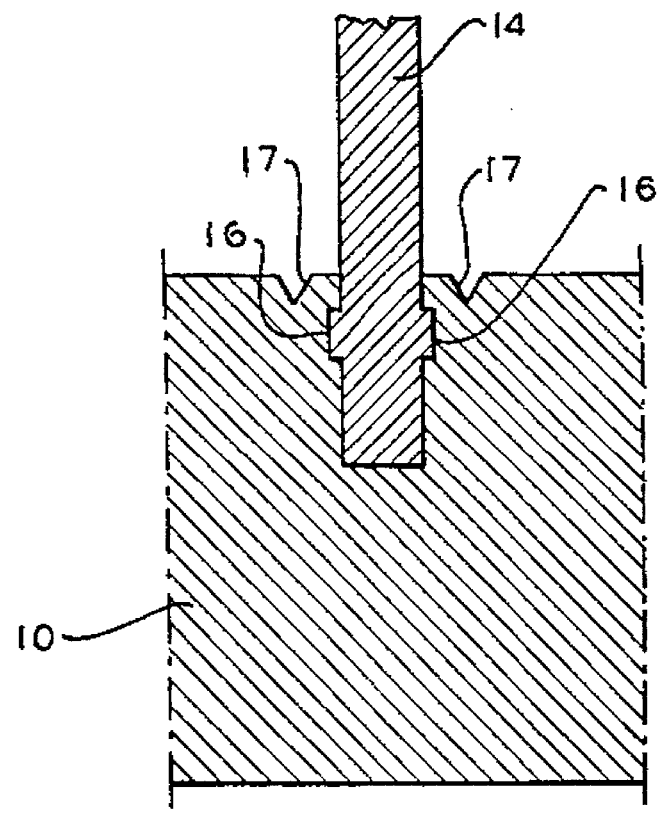
FIG. 7 is a cross section of an essential part showing another embodiment of the fin.

The lower portion of the fin 14 is fitted to the groove 12, and is fixed firmly to the wall surface of the groove 12 by a pressure deformed portion 17 provided in the vicinity of the groove 12. The engaging portion 16 is not particularly limited to a construction of being formed on both sides of the lower portion of the fin 14, and as shown in FIG. 6, it may be provided only on one side or depending on the case, it may not be provided. Also, the engaging portion 16 may be formed with a convex portion 16a as shown in FIG. 7. Also, the pressure deformed portion 17 is not particularly limited to a construction of being formed on both sides of the groove 12, and may be formed on one side of the groove 12.

A method of producing the radiation plate will be described in the following according to each process.

[Base groove forming process ]

Figure 11:
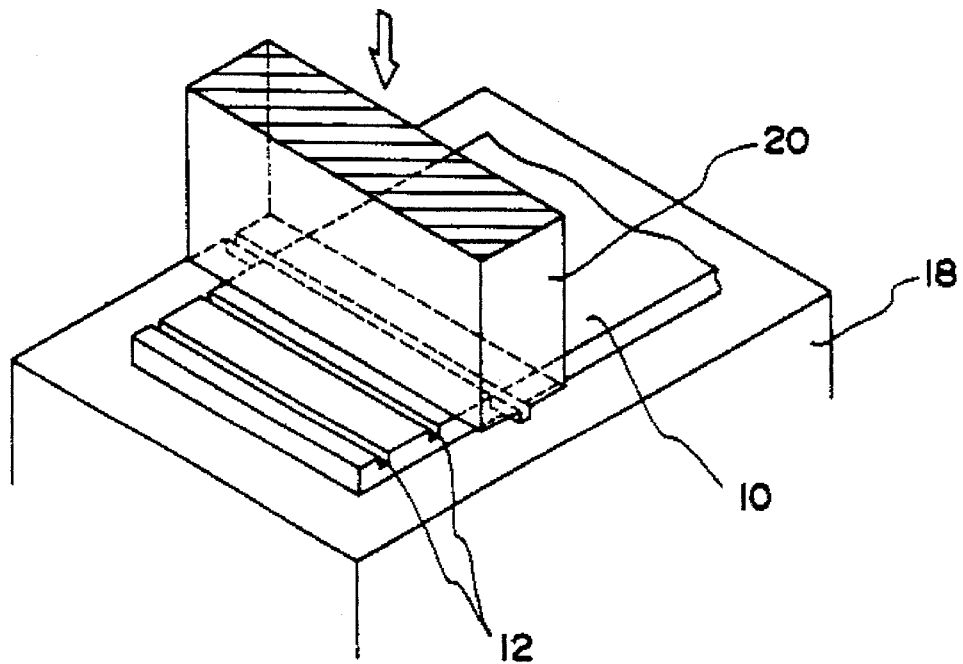
FIG. 11 is an external view showing a process of forming a groove on the base.
Figure 12:
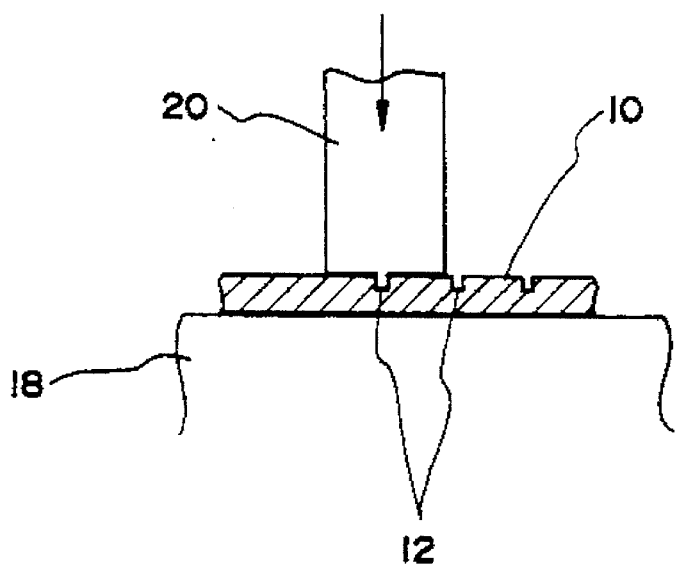
FIG. 12 is a side view showing a process of forming the groove on the base.

FIG. 11 and FIG. 12 show a process of forming the groove 12 on the base 10.

Numeral 18 denotes a mounting table, and 20 denotes a mold, and the mold 20 is connected to a lift drive device, and is arranged to move on the mounting table 18 at a certain pitch. In the foregoing construction, the base 10 is fixed on the mounting table 18, and this base 10 is pressurized by the mold 20 at a certain pitch thereby forming the groove 12 on the base 10 at a certain pitch.

By the way, a method of forming the groove 12 on the base 10 may be replaced with cutting work by milling cutter in addition to the pressure mold process.

[Fin engaging portion forming process]

Figure 13:
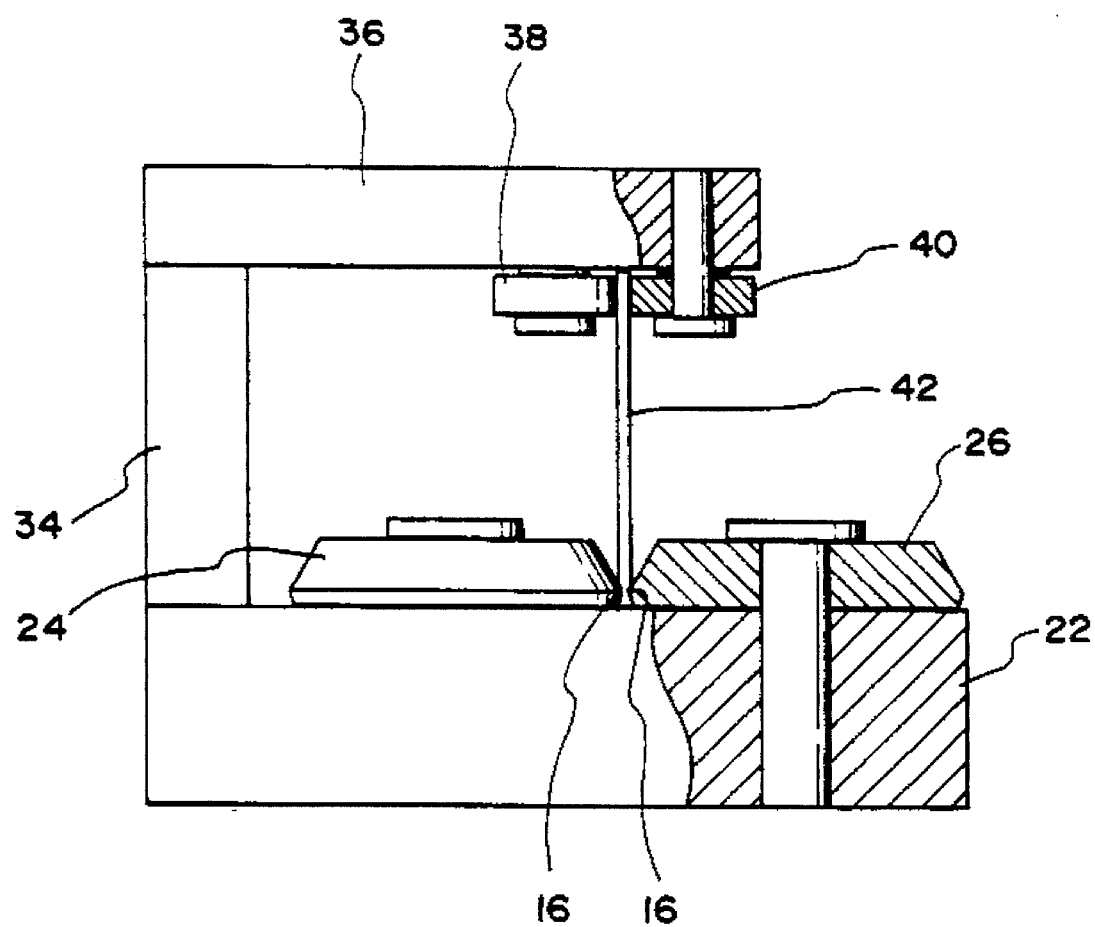
FIG. 13 is a side view showing a process of forming an engaging concave portion on the fin.
Figure 14:
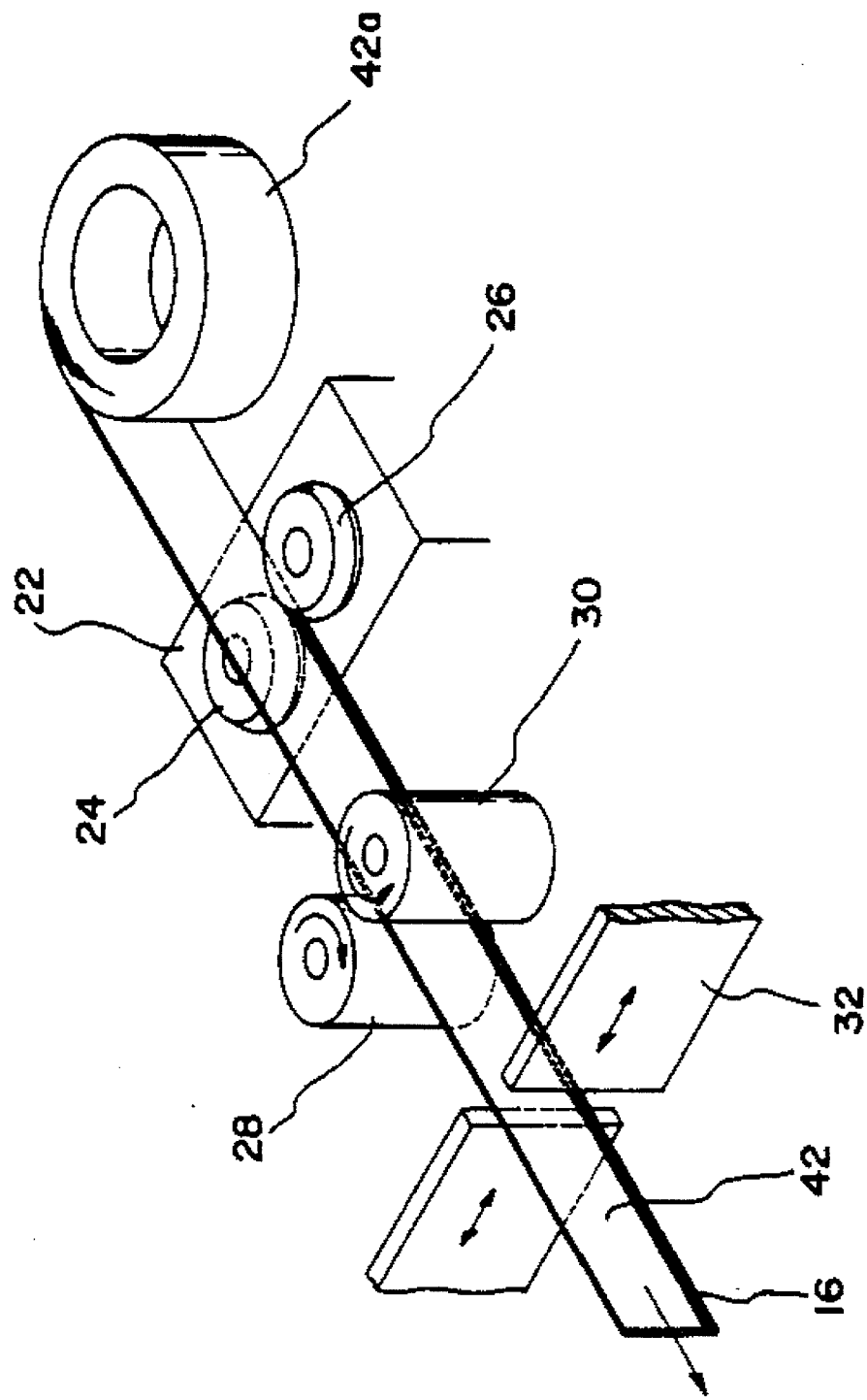
FIG. 14 is an external view showing a process of forming the engaging concave portion of the fin.

A process of forming the engaging portion 16 for prevention of come-out at a lower portion of the fin 14 is described in the following by referring to FIG. 13 and FIG. 14.

A pair of groove forming rollers 24 and 26 are rotatably journalled on a mounting table 22. Moreover, feed rollers 28 and 30 and a shear cutter 32 are provided on a belt-like fin material transfer passage on the mounting table 22. A fin float holder 36 is fixed to a bracked 34 erected on the mounting table 22, and the holder 36 is rotatably Journalled with fin fall preventive guide rollers 38 and 40. A roll portion 42a of the belt-like fin material 42 is rotatably journalled on the mounting table 22, and the fin material 42 is fed from the roll portion 42a, and is made to pass between the groove forming rollers 24 and 26 by the drive force of the feed rollers 28 and 30.

Figure 15:
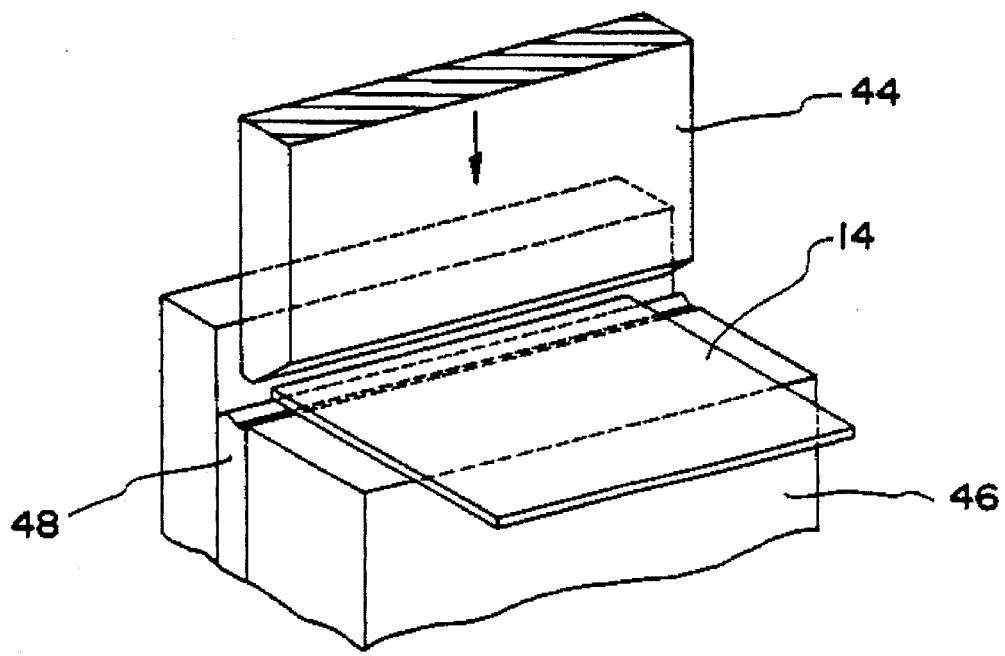
FIG. 15 is an external view showing another embodiment of a process of forming the engaging concave portion on the fin.
Figure 16:
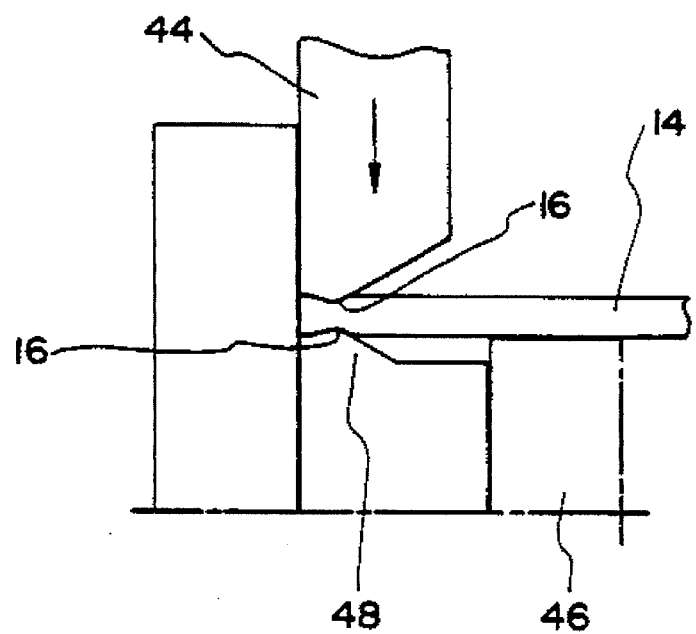
FIG. 16 is a side view showing another embodiment of a process of forming the engaging concave portion on the fin.

At this time, the concave engaging portion 16 is formed on the fin material 42 by the groove forming rollers 24 and 26. The fin material 42 formed with the engaging portion 16 is cut to a predetermined length by the shear cutter 32 to provide a fin. FIG. 15 and FIG. 16 show another embodiment of the engaging portion forming process. The pare aluminum made fin 14 is sandwiched with pressure by and upper mold 44 connected to the lift drive device and a lower mold 48 provided on the mounting table 46, thereby forming the engaging portions 16 and 16 consisting of the concave portion on the fin 14.

Figure 22A:
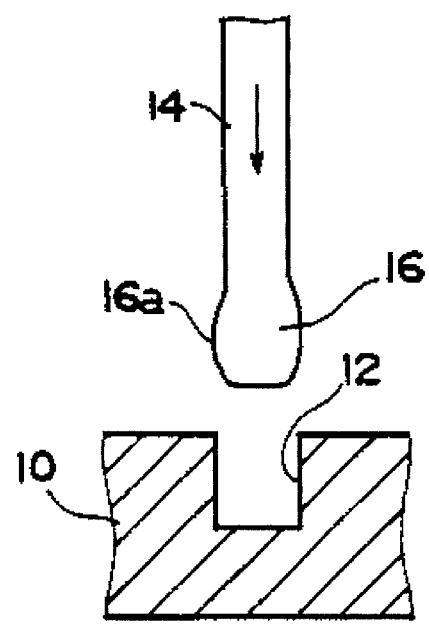
FIG. 22a is a large scale side view before a porcess of making an expanded end of the fin engaged in the groove of the base.
Figure 22B:
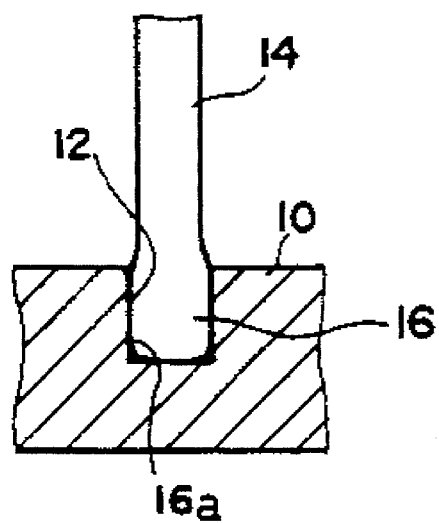
FIG. 22b is a large scale side view making the expanded end shown in FIG. 22a engage in the groove shown in FIG. 22a by a pressure means.
Figure 23:
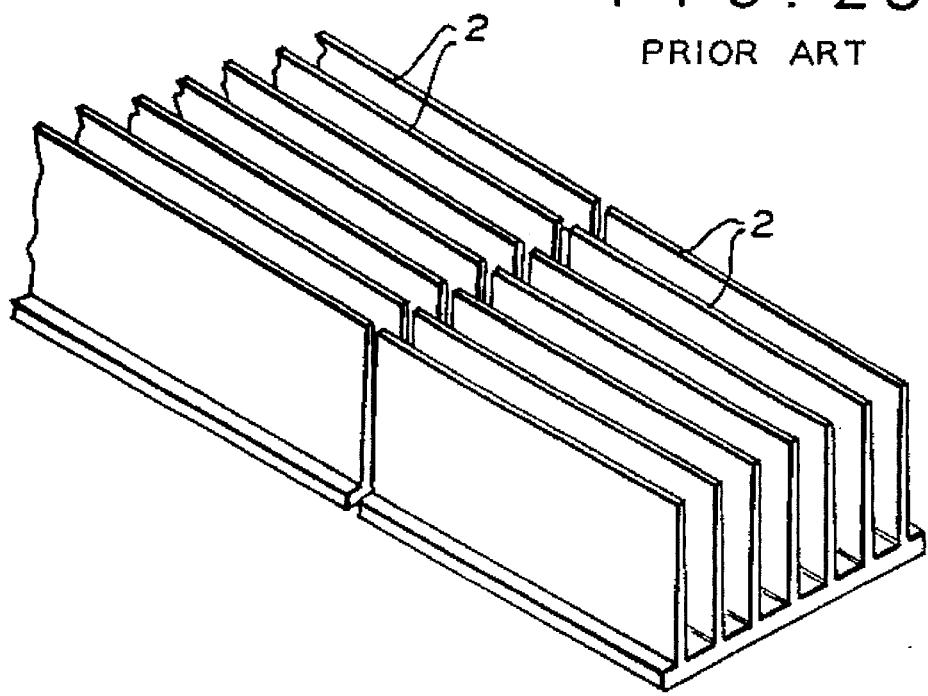
FIG. 23 is an external view of a prior art.
Figure 24:
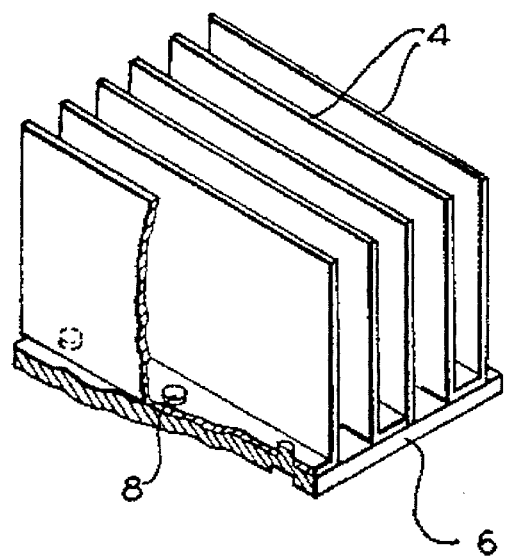
FIG. 24 is an external view of the prior art.
Figure 25:
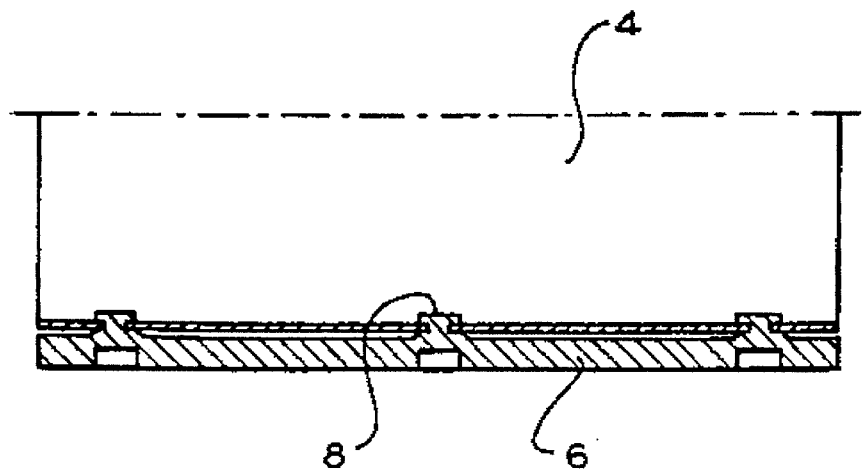
FIG. 25 is an elevational cross section of the prior art.
Figure 26:
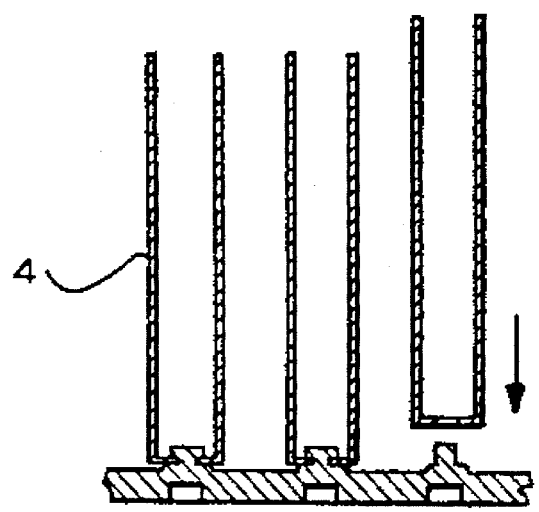
FIG. 26 is a side view cross section of the prior art.

On the other hand, the engaging portions 16 consisting of the convex portion 16a may be formed an end of the fin 14 as shown in FIG. 22a, FIG. 22b by a rolling technique.

[Process for fixing fin to groove of base]

Figure 17:
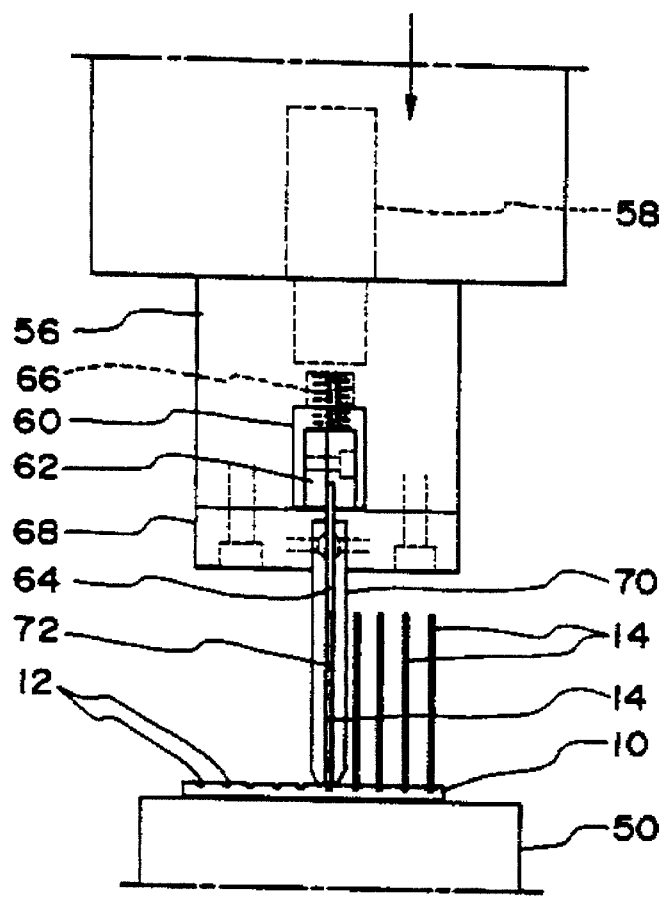
FIG. 17 is a side view showing a process on fixing the fin to the base.
Figure 18:
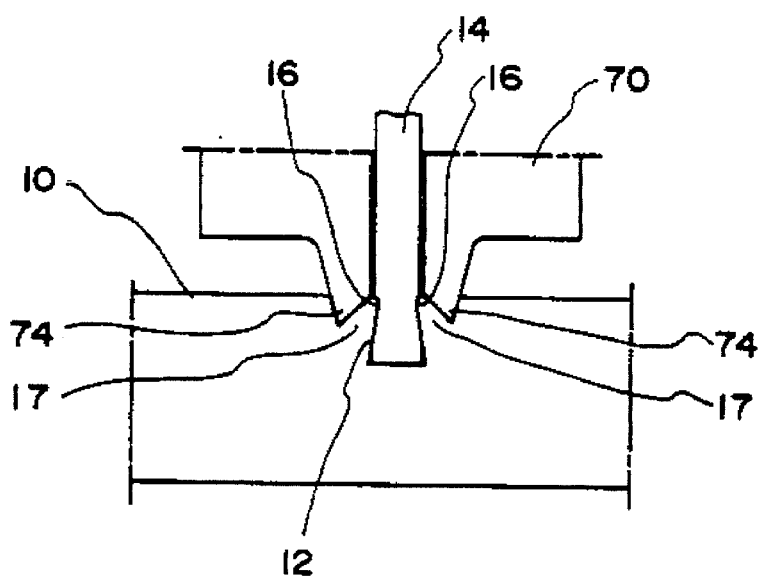
FIG. 18 is an enlarged side view showing an essential part showing a process of fixing the fin to the base.
Figure 19:
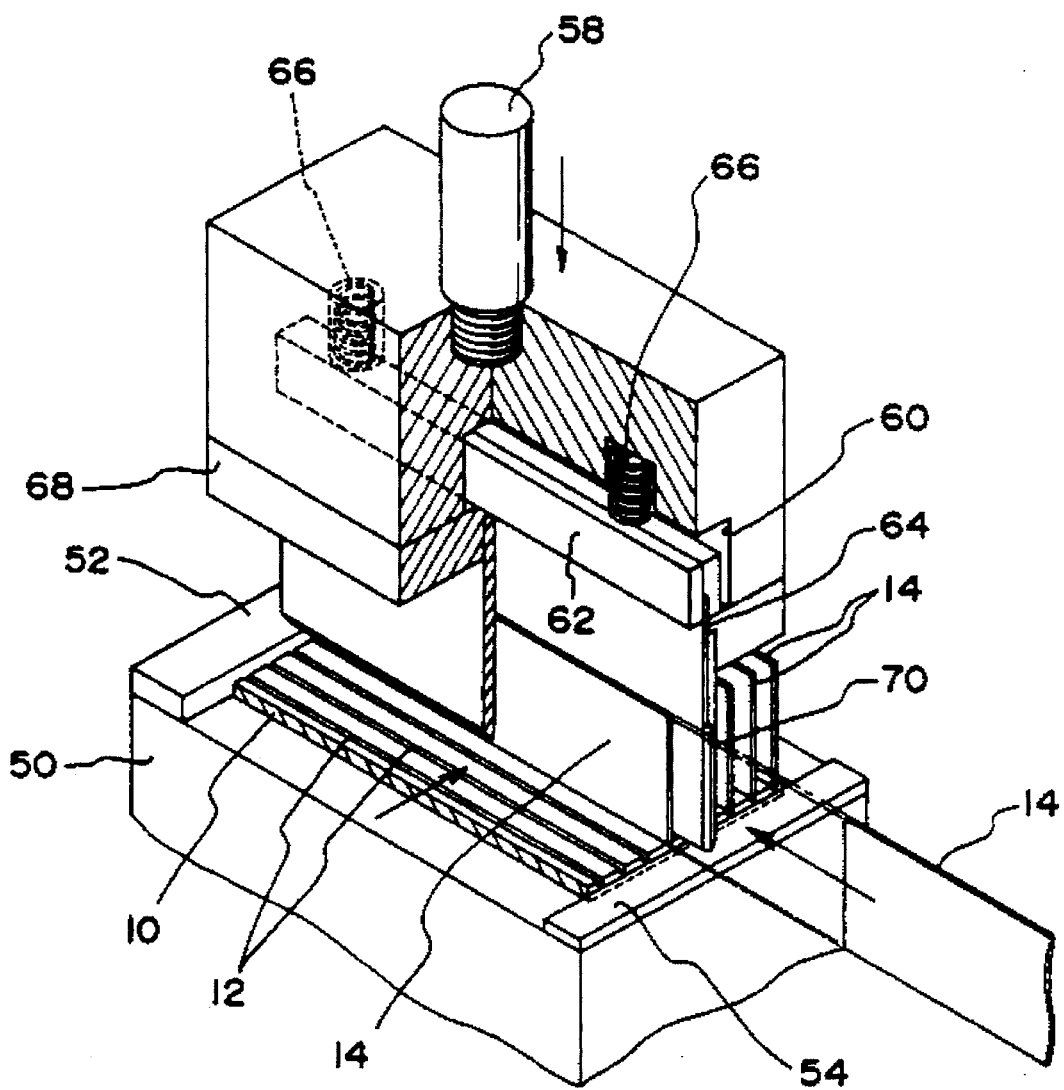
FIG. 19 is an external view whose part is cut out showing a porcess of fixing the fin to the base.

A process for fixing the lower portion of the fin 14 on the groove 12 of the base 10 will be described in the following. In FIG. 17 through FIG. 19, numeral 50 denotes a mounting table, and positioning plates 52 and 54 for controlling both ends of the base 10 are fixed to the mounting table 50.

Numeral 56 denotes a lift member, and is connected to an output shaft of the lift drive device in which a shaft 58 fixed to the lift member is supported on the machine body (illustration is omitted). The lift member 56 is supported on the mounting table 50 so that it can be shifted in a direction parallel to the positioning plate 52. A lateral hole 60 is formed on a center portion of the lift member 56, and a holder 62 is liftably disposed in the latertel hole 60.

A bolder plate 64 is fixed to the holder 62. The holder 62 is energized downward by a coil spring 66 disposed in the lateral hole 60, and the holder 62 is in resilient contact on the upper surface of a bottom member 68 of the lift member 56. An upper portion of a plate-like pressure member 70 is fixed to the bottom member 68 of the lift member 56. A slit 72 is formed in the inside of the pressure member 70, and the holder plate 64 is inserted and disposed in the slit groove 72. A tapered pressure blade 74 is formed on the lower end of the pressure member 70.

In the foregoing construction, in the condition where the lift member 56 is raised to a predetermined position, the base 10 is positioned on the mounting table 50.

Next, the pressure member 70 is shifted just above a desired groove 12 of the base 10. Next, the lower portion of the fin 14 is inserted into the selected groove 12 in a horizontal direction using a slit 72 of the pressure member 70 as a guide.

Next, the lift member 56 descends, and the vicinity of the groove 12 to which the lower portion of the fin 14 is inserted is applied with pressure by the pressure blade 74, and the pressure deformed portion 17 is formed in the vicinity of the groove 12 of the base 10. By this forming, the lower portion of the fin 14 is firmly fixed to the wall surface of the groove 12 of the base 10.

When the lift member 56 descends the holder plate 64 comes to contact the upper end of the fin 14 under pressure by a resilient force of the coil spring 66, preventing the float phenomenon of the fin 14.

After the fin 14 is fixed to the groove 12, the lift member 56 is raised, and the lift member 56 is released from the fin 14, and thereafter, the pressure member 70 is shifted to the upper part of the next groove 12, and the fin 14 is fixed to the next groove 12 by the manner described in the foregoing.

The fin 14 is erected on the base 10 sequentially as described above.

Figure 20:
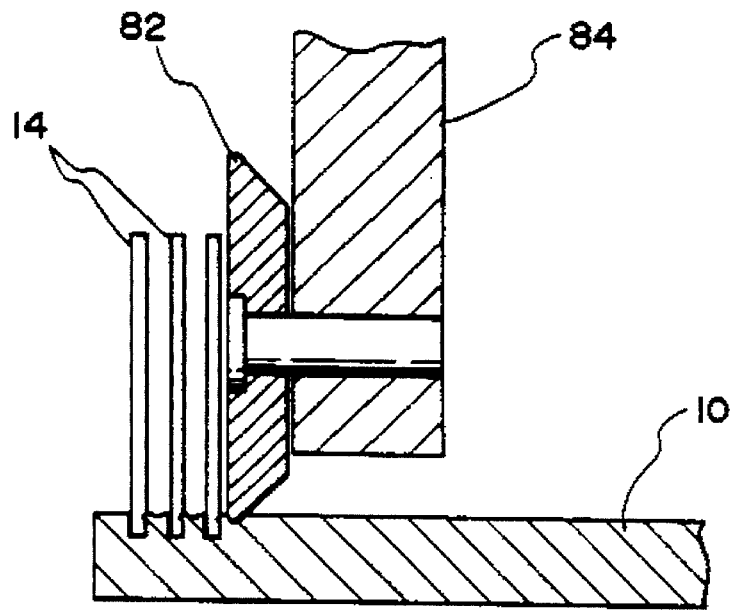
FIG. 20 is a cross section whose part is cut out showing another embodiment of a process of fixing the fin to the base.

The foregoing embodiment provised that the pressure deformed portion 17 is formed at both sides of the groove 12 of the base 10, and the lower portion of the fin 14 is firmly fixed to the wall surface of the groove 12 of the base 10 by the formation, but, as shown is FIG. 20, a disc-like pressure member 82 is rotatably Journalled on a holder 84 capable of lifting and shifting in a linear direction and a direction orthogonal to the linear direction, and the one side of the groove of the base 10 is applied with the pressure by means of the pressure blade of the pressure member 82, and the pressure deformed portion is formed on one side of the groove of the base 10, and the fin 14 may be erected on the base 10 sequentially.

Figure 21:
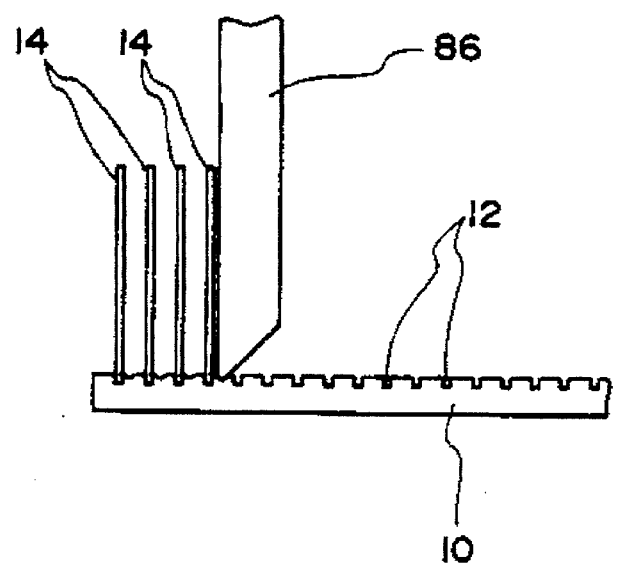
FIG. 21 is a cross section whose part is cut out showing another embodiment of a process of fixing the fin to the base.

Also, as shown in FIG. 21, a pressure member 86 having a width almost identical with the length of the groove 12 is journalled on a holder capable of lifting and of shifting in the pitch direction, and the one side of the groove 12 of the base 10 is applied with pressure by the pressure blade of the pressure member 86 to form the pressure deformed portion 35 on one side of the groove of the base 10, and the fin 14 may be erected on the base 10 sequentially.

A smaller pitch of the fins 14 may be obtained by the foregoing construction.

As shown in FIG. 22a and FIG. 22b, a fin 14 having an expanded end 16a will be able to fix on the base 10 by means of the pressure operation system utilizing such apparatus as shown in FIG. 19.

FIGS. 8a, 8b, 8c, 8d, 8e, 9a, 9b, and 10 show other several embodiments of the radiation plate.

Figure 8A:
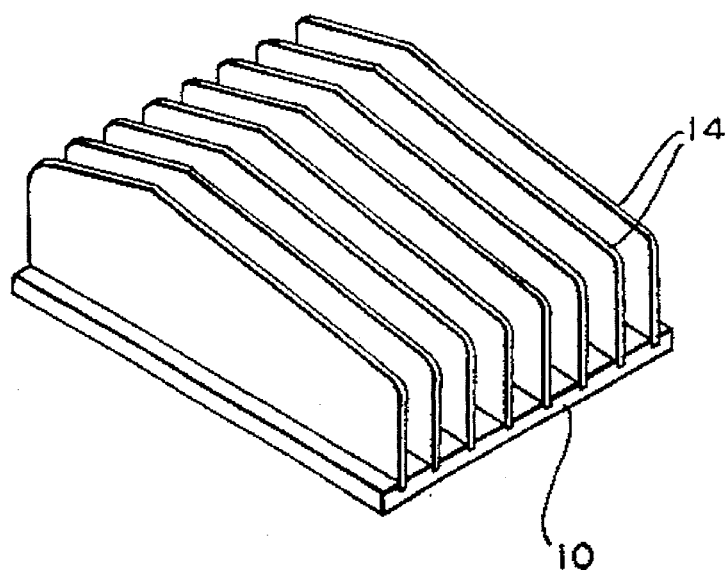
FIGS. 8a, 8b, 8c, 8d, and 8e are external views showing other several embodiments of the radiation plate.

In the method of inserting the fin 14 into the base 10, as described in the foregoing, the shape of the fin is not required of being made uniform as found in the prior arts, and each piece of the fin 14 may be formed like a mountain as shown in FIG. 8a, and even in case of designing the radiation plate which projects outside in the acoustic related industry in particular, it becomes possible to provide a better design.

Figure 8B:
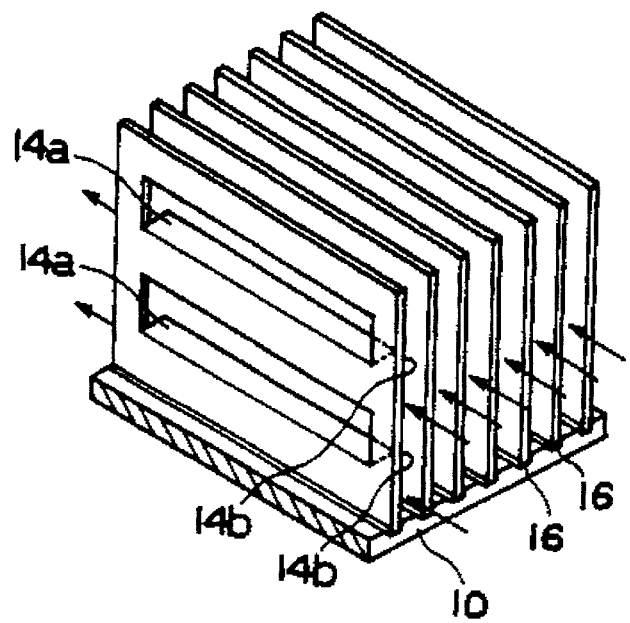

FIGS. 8b, and 9 show other embodiments of the radiation plate forming multiple air flow passages 14b consisted of multistage by one more bends 14a on the way of each fin 14 and the said passages make the radiation of fin 14 more effective.

Figure 8C:
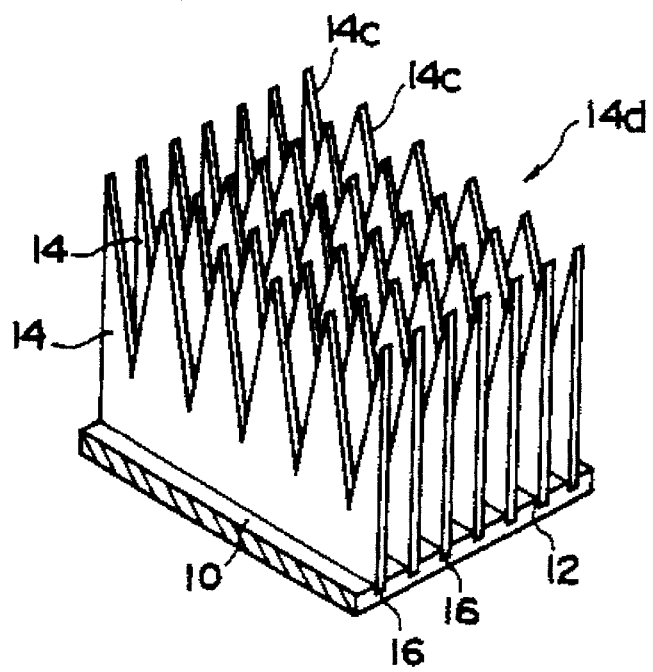

Further FIG. 8c shows another embodiment forming a frog 14d consisted of a lot of sharp points 14c in each fin 14 and the frog 14d makes the effect of the radiation of fin 14 more successful.

Figure 8D:
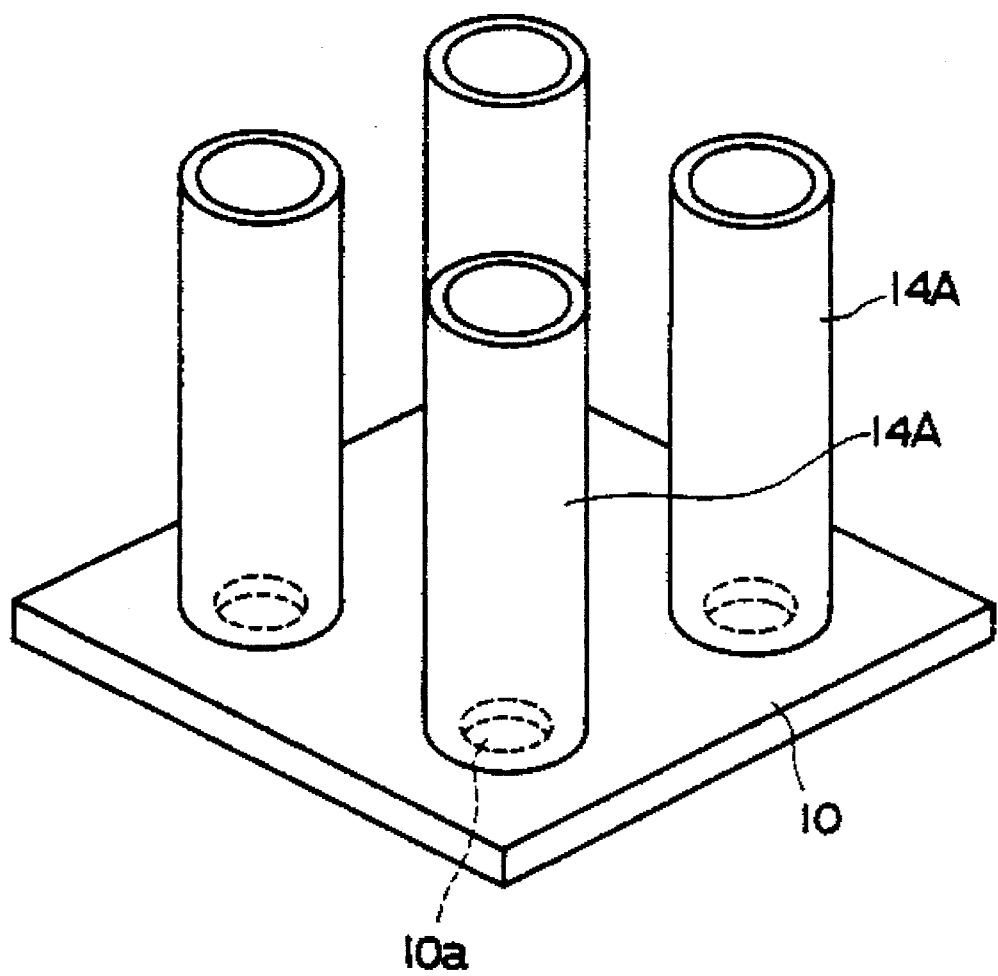
Figure 9A:
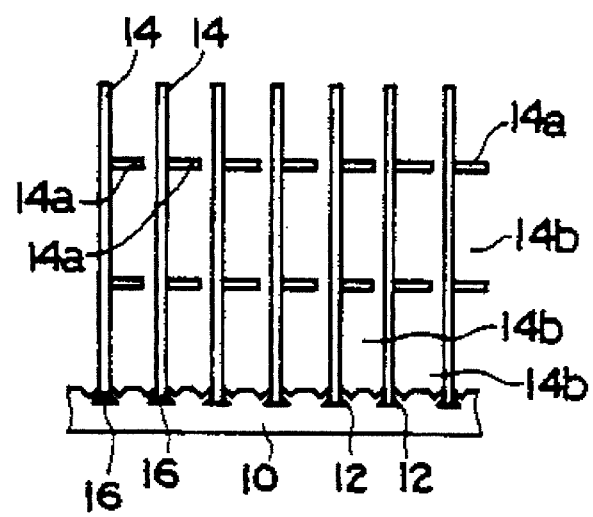
FIG. 9a is a cross section of the radiation plate as shown in FIG. 8b.
Figure 9B:
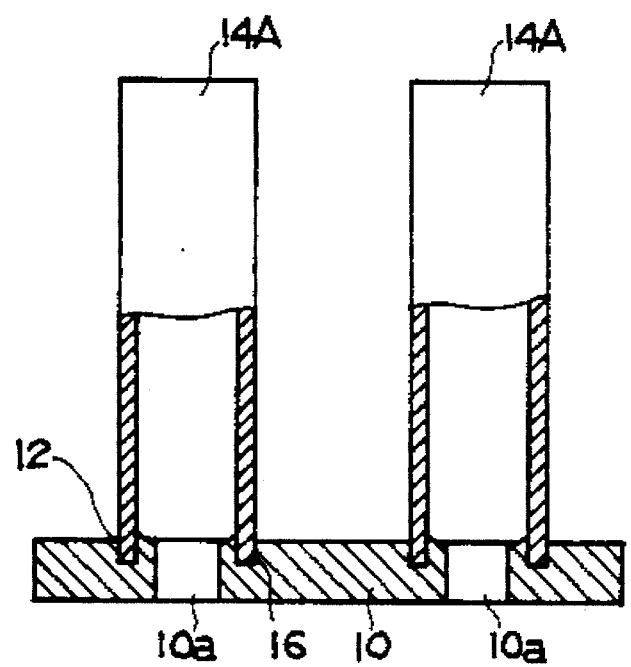
FIG. 9b is a cross section of the radiation plate as shown in FIG. 8d.

And FIGS. 8d, 9b show other embodiments having a pipe style fin 14A instead of the flat fin and a small hole 10a in the base 10 inside the fin 14A and the pipe style fin 14A with small hole 10a makes the effect of the radiation of fin 14 more actively.

Figure 8E:
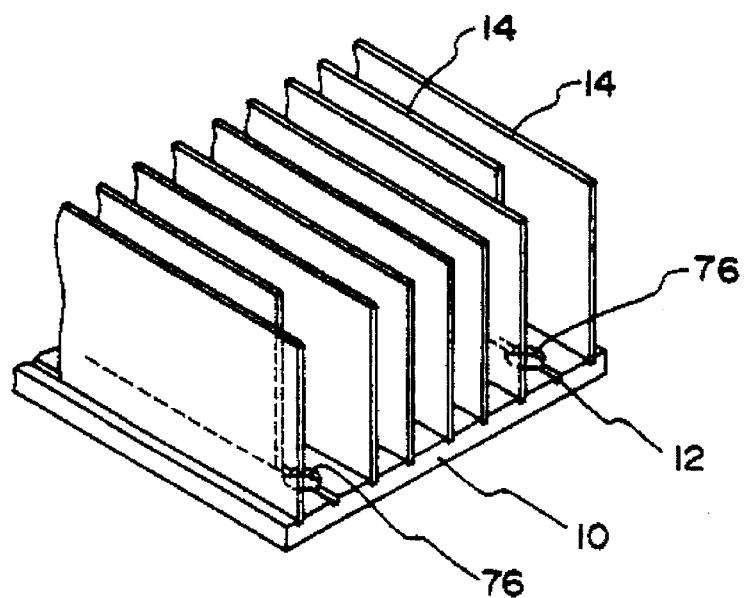

FIG. 8e shows a radiation plate provided with short fins 14 longitudinally between the foregoing fins 14. In the radiation plate, setting and releasing become easy by providing a screw hole 76 for fixing at a location of the short fin 14.

Furthermore being not shown in embodiments by drawings, it will freely be able to combine with different shape fin about the fin fixed on the base 10.

Figure 10:
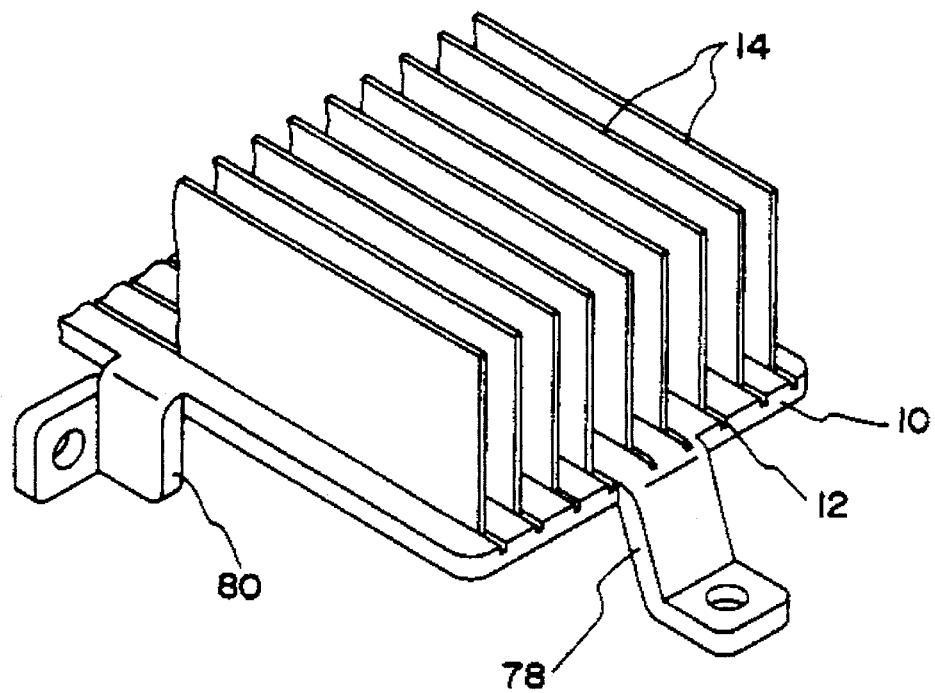
FIG. 10 is an external view showing another embodiment of the radiation plate.

FIG. 10 shows that projection stationary member 78 and 80 are provided on the base 10. Different from the case of the conventional molding, the radiation plate shown in FIG. 10 may be easily manufactured. By the way, the base 10 mentioned above may not be limited to particularly to flat plate-like member, and may be a curved plate-like member.

The present invention to be embodied by the foregoing construction is a system of assuring a production mode meeting not only mass production but also quickly with sample making, model change, desing change, start-up of the mass production and the like, and with this invention, it can meet with a small quantity production, and can meet with any kind of requirements. Also, more than anything else, the pitch of the fins may be made smaller even if using a material of low hardness such as pure aluminum as a material for fin, and also, there is tightness in a coupled portion between the base and the fin, and with this advantage, high heat radiation and avoidance of resonance phenomenon can be accomplished. Furthermore, the manufacturing of the radiation plate may be automated which is one of many effects of this invention.

What is claimed is:

1. A method of manufacturing a radiation plate comprising forming a fin whereby a belt-like fin material is transferred by a pair of feed rollers, whereby a side edge of said fin material is deformed and expanded by a pair of groove forming rollers, and said fin material is cut at a desirable length by a cutter means, forming a base groove for the fin at a certain pitch on a base surface, and engaging the fin whereby the fin is held by a slit formed by a pair of plate-like pressure members, a side edge of the fin is pushed into the base groove by shifting a lift member, an outer portion of the base groove is deformed by a tapered pressure blade formed at a tip of a pair of the pressure members, and a part of the fin is engaged on the base groove.

* * * * *